United States Patent [19]

Béchade

[11] Patent Number: 4,742,019

[45] Date of Patent: May 3, 1988

[54] METHOD FOR FORMING ALIGNED INTERCONNECTIONS BETWEEN LOGIC STAGES

[75] Inventor: Roland A. Béchade, South Burlington, Vt.

[73] Assignee: International Business Machines Corporation, Armonk, N.Y.

[21] Appl. No.: 792,997

[22] Filed: Oct. 30, 1985

[51] Int. Cl.⁴ .................. H01L 21/38; H01L 21/44
[52] U.S. Cl. .................................. 437/48; 307/445; 307/448; 357/41; 437/52; 437/195; 437/49
[58] Field of Search ............... 29/577 C, 571, 577 R; 357/45, 40, 42, 46; 307/445, 448; 437/48, 49, 52, 195

[56] References Cited

U.S. PATENT DOCUMENTS

| | | | |
|---|---|---|---|
| 4,125,854 | 11/1978 | Mckenny et al. | 357/45 |
| 4,235,010 | 11/1980 | Kawagoe | 29/577 C |
| 4,319,396 | 3/1982 | Law et al. | 29/571 |
| 4,352,031 | 9/1982 | Holbrook et al. | 357/45 |
| 4,458,297 | 7/1984 | Stopper et al. | 357/45 |
| 4,602,270 | 7/1986 | Finegold et al. | 357/42 |
| 4,627,152 | 12/1986 | DeHond et al. | 29/577 C |
| 4,644,382 | 2/1987 | Charransol et al. | 357/45 |

FOREIGN PATENT DOCUMENTS 1569866  6/1980  United Kingdom .................. 29/580

OTHER PUBLICATIONS

Weinberger, "Large Scale Integration of MOS Complex Logic: A Layout Method", IEEE J. of Solid-State Circuits, vol. SC-2, No. 4, Dec. 1967, p. 182.
Cook et al. Polysilicon Gate MOSFETs for Weinberger-Type Random Logic Arrays, IBMTDB, vol. 19, No. 6, Nov. 1976, pp. 2303-2304.

*Primary Examiner*—George T. Ozaki
*Attorney, Agent, or Firm*—Sughrue, Mion, Zinn, Macpeak and Seas

[57] ABSTRACT

A layout for random logic in which different stages are assigned to columns according to the flow of logic signal. Each stage may consist of several parallel logic blocks defining a logic function and having an output. The logic blocks are implemented by several diffusion areas, not necessarily contiguous. The output line of a logic block is aligned vertically to match one or more gate electrodes of following stages that it drives. The interconnection to the following stages can be implemented by a single horizontal polysilicon line which also functions as the gate electrodes. The breaks in the diffusion of a logic block can accommodate the passage of polysilicon lines not being used in that logic block.

10 Claims, 3 Drawing Sheets

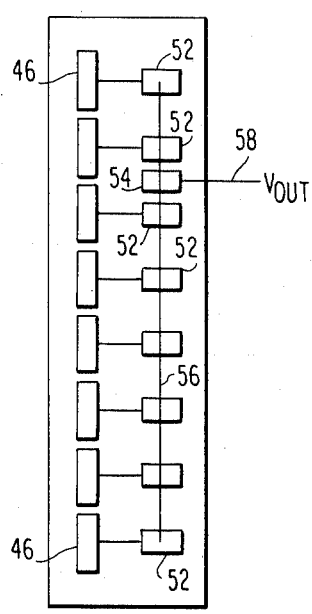
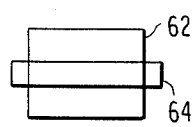
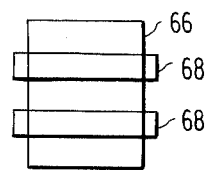
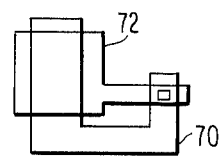
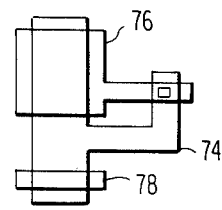
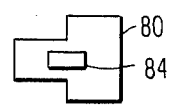
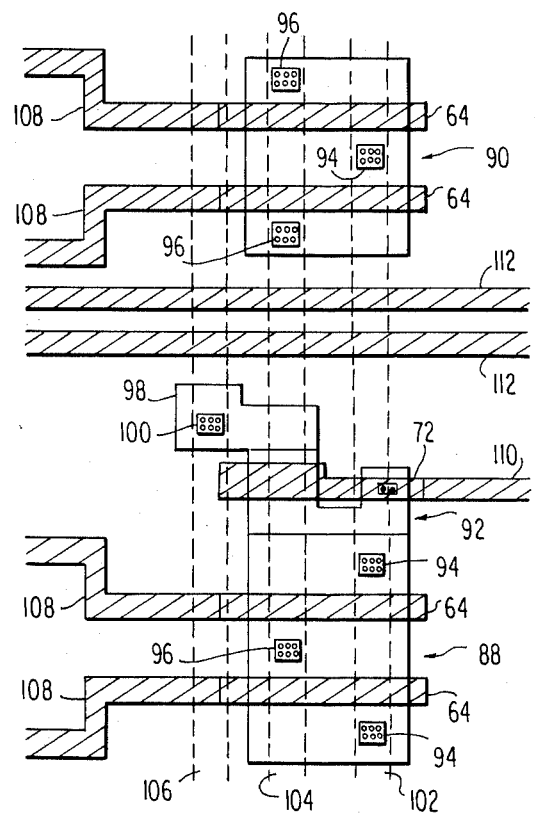

4,742,019

METHOD FOR FORMING ALIGNED INTERCONNECTIONS BETWEEN LOGIC STAGES

BACKGROUND

This invention relates generally to the layout of a semiconductor chip. In particular, the invention relates to a method of arranging the components of a logic stage so as to align the outputs of one stage with the inputs of another stage.

A popular type of logic circuit suited for implementation in MOSFET (metal-oxide-semiconductor field-effect transister) technology is described by Weinberger in a technical article entitled "Large Scale Integration of MOS Complex Logic: A Layout Method" and appearing in IEEE Journal of Solid-State Circuits, Vol. SC-2, No. 4, December 1967 at pages 182–190. An illustrative example of a gate-level representation of a logic circuit of this logic is shown in FIG. 1. A load transistor 10 is connected in series with a logic group 12 between a fixed power supply voltage $V_{DD}$ and ground. The connection between the load transistor 10 and the logic group 12 is connected to the output $V_{out}$ of this stage of the logic. Within the logic group 12 is a configuration of logic transistors 14, each gate of which is controlled by a logic output $V_{out}$ of a another logic circuit or possibly one of the inputs to the chip. The number and arrangement of the logic transistors 14 determine which logic function is performed by the logic group 12. The values of the signals applied to the gates of the logic transistors 14 control the output $V_{out}$. If the input signals cause a conduction path to ground through the logic group 12, then the output $V_{out}$ is at ground potential. If no conduction path is created, then the output $V_{out}$ is at the power supply potential $V_{DD}$. Only a single logic stage is represented in FIG. 1. In a typical logic chip, there would be very many logic circuits, with the outputs $V_{out}$ of some circuits controlling the gates of the logic transistors 14 of other circuits.

An efficient and compact semiconductor layout for parts of the circuit of FIG. 1 is shown in FIG. 2. A low resistivity semiconductor substrate is first covered with a thick oxide. Thereafter, the thick oxide is selectively removed to expose areas for a diffusion well 16. A thin oxide is then grown to form a gate insulating oxide in selected regions. Polysilicon lines are formed which cross the diffusion well 16 in the area of the thin gate oxide to define gate electrodes 18. Then the chip is uniformly subjected to ion implantation to create a higher semiconductor resistivity in portions of the surface of the semiconductor covered neither by the thick oxide nor the polysilicon lines, that is, to form and activate the diffusion well 16. The term diffusion well is a misnomer because the diffusion well 16 of FIG. 2 is not, in this case, formed by diffusion and is not a continuous well but is interrupted by the gate electrodes 18. Nonetheless, the terminology is common and will continue to be used. After an insulating oxide is grown or deposited, at least two metal lines 20 and 22, called the first metallization, are deposited transversely to the polysilicon electrodes 18 across the diffusion well 16. However, prior to the deposition of the metal lines 20 and 22, two contact holes 24 and 26 are formed through the intervening oxide in order that the metal lines 20 and 22 are connected to the diffusion well 16 at selected points. One metal line 20 is connected to the output voltage $V_{out}$ and the other metal line 22 is connected to ground. The polysilicon gate electrodes 18 are separately connected to input lines controlling the gates of the logic transistors 14. The layout of FIG. 2 produces the logic configuration shown in FIG. 3 which is a two-input NAND gate. Obviously, a higher order NAND gate could be produced by including more gate electrodes 18 between the two contact holes 24 and 26.

An alternative configuration is shown in FIG. 4, which is identical to FIG. 2 except for the locations of contact holes 28, 30 and 32, which alternate between the output voltage $V_{out}$ and ground. The layout of FIG. 4 produces the logic circuit shown in FIG. 5 which is a two-input NOR gate. Obviously again, a higher order NOR gate could be produced by including more gate electrodes 18 and more alternating contact holes 28–32.

The load transistor 10 can be easily implemented as shown in FIG. 6. A C-shaped diffusion well 34 is formed with a polysilicon gate electrode 36 crossing both arms of the diffusion well 34. The use of polysilicon gate electrodes in a Weinberger array is described by Cook et al in a technical article entitled "Polysilicon Gate MOSFETs for Weinberger-Type Random Logic Arrays" appearing the the IBM Technical Disclosure Bulletin, Vol. 19, No. 6, November 1976 at pages 2303–2304. A contact hole 38 connects the gate electrode 36 with the diffusion well 34 through the intervening oxide. The power supply $V_{DD}$ is connected to the free end of the arm of the diffusion well 34 other than that having the contact hole 38. The output voltage $V_{out}$ can be connected either to the gate electrode 38 or to the common side 40 of the diffusion well 34.

From the above discussion, it is apparent that a complete logic circuit illustrated in FIG. 1 can neatly be arranged in a vertical column with a single diffusion well. As a result, a logic chip can be built as a series of logic circuits, each having a particular logic function and with a single output of one circuit being used as one of several inputs of other logic circuits 44. Generally, the circuits are ordered in sequential stages with signals flowing from one side of a chip to the other.

One difficulty with the usual circuit arrangement on a chip lies in the interconnections between the circuits. An example of the difficulty is shown in FIG. 7 which shows the outputs of eight logic circuits 46 being combined in another logic circuit 48 which provides an 8-way NOR function. Eight interconnections 50 are required between the eight circuits 46 and the NOR circuit 48. A substantial length of the interconnections is vertically arranged in parallel between the circuits 46 and 48. Such a large number of vertical portions require that the circuits 46 and 48 be widely separated to accommodate the vertical portions, thus decreasing the packing density of the chip.

SUMMARY OF THE INVENTION

Accordingly, it is an object of the invention to provide a layout for FET logic which minimizes the length of connections between logic circuits.

It is a further object of the invention to provide such a layout which aligns the common inputs to different logic circuits.

It is yet a further object of the invention to provide such a layout which allows the alignment of the output of one logic circuit with the corresponding input of another logic circuit.

The invention can be summarized as a layout of random logic in an integrated circuit. Logic blocks of perhaps multiple logic circuits are arranged in columns generally corresponding to the flow of signals from one column to another. The logic blocks are further broken up into diffusion areas which are placed within the columns so that a gate electrode of one column is aligned with the output line of another column driving that gate electrode or so that the gate electrodes in two different columns which share the same controlling signal are aligned. Logic circuits may be interleaved within a column. Interconnections between columns are preferentially accomplished by a continuous horizontal polysilicon line which can be used also as the gate electrode. Contact is established among the diffusion areas either by juxtaposing different diffusion areas or using an upper metallization layer. Breaks in the diffusion areas can be used to pass other polysilicon lines not being used in the logic block.

BRIEF DESCRIPTION OF THE DRAWINGS

FIG. 8 illustrates the interconnections of logic blocks made possible by the present invention.

FIGS. 9–14 illustrate standard cells used to construct an integrated circuit.

FIGS. 15 and 16 illustrate two embodiments of portions of a logic circuit built according to the present invention.

DETAILED DESCRIPTION OF THE PREFERRED EMBODIMENTS

Figure 7:
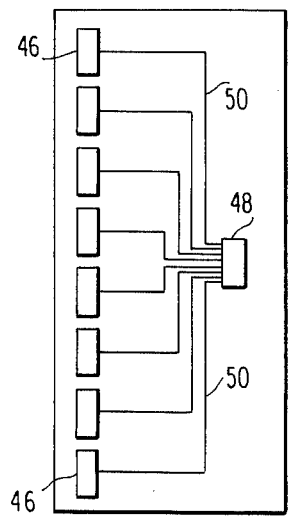
FIG. 7 illustrates the interconnections of logic circuits in the prior art.

The above objects are accomplished by realizing that a logic circuit does not need to be a physically contiguous entity. As shown in FIG. 8, which is logically equivalent to FIG. 7, the NOR circuit 48 is broken up into eight 1-input NOR sub-blocks 52, which however lack a load transistor. Each NOR sub-block 52 is one-half of the 2-input NOR circuit of FIG. 4 and includes one gate electrodes 18 and two contact holes 28 and 32. A separate load sub-block 54 can be located freely. The NOR sub-blocks 52 and the load sub-block 54 are arranged in a column with free space in between. The NOR sub-blocks 52 and the load sub-block 54 are linked by two common reference lines 56, in this case ground and the output voltage node $V_{out}$. It is not even necessary that a horizontal line 58 for the output $V_{out}$ be attached to the load sub-block 54 since any part of one of the two common reference lines 56 carries the same output voltage $V_{out}$. Thus the horizontal line 58 can be aligned to an input of a following stage. It is also seen that the eight sub-blocks 46 of FIG. 8 can be aligned to their own input lines.

Figure 1:
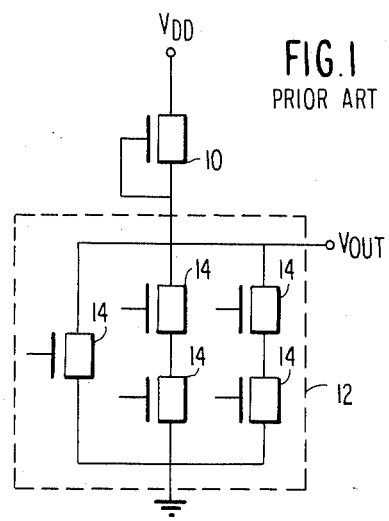
FIG. 1 is a gate level representation of a logic circuit.
Figure 2:
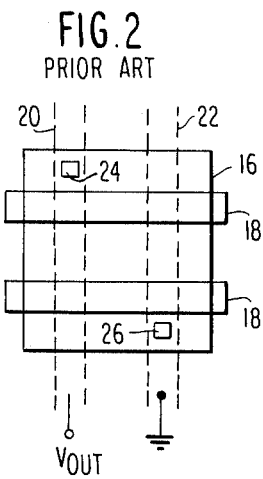
FIGS. 2, 4 and 6 are semiconductor level representations of two active areas of a logic circuit.
Figure 3:
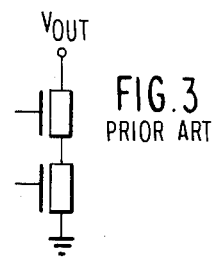
FIGS. 3 and 5 are gate level representations of FIGS. 2 and 4 respectively.
Figure 4:
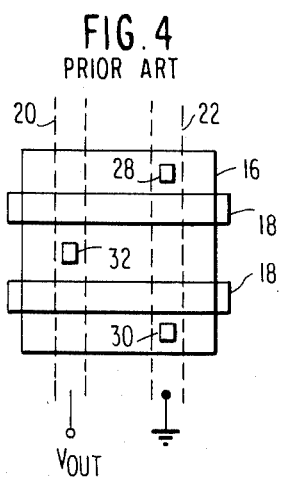
Figure 5:
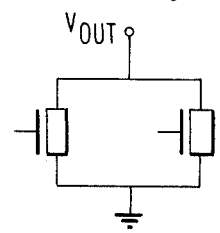
Figure 6:
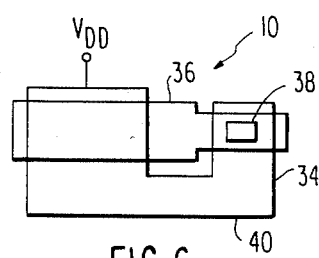

The layout of FIG. 8 can be accomplished by further realizing that the diffusion wells of FIGS. 2, 4 and 6 do not need to be connected as was generally the practice in the prior art. Instead, they can be linked to a common voltage node by contacts to a first metallization.

A cell library is created which have fixed patterns for diffusion, polysilicon electrodes and contact holes. The cell library approach for topological layout of devices in an integrated circuit has been described by Vergnieres in a technical article entitled "Macro Generation Algorithms for LSI Custom Chip Design" appearing in the *IBM Journal of Research and Development*, Vol. 24, No. 5, September 1980 at pages 612–621. FIG. 9 shows a cell with a diffusion well 62 and one polysilicon gate electrode 64. FIG. 10 shows a cell with a diffusion well 66 and two polysilicon gate electrodes 68. As was explained with reference to FIGS. 2 and 4, the cells of FIGS. 9 and 10 can be used for either NAND or NOR gates depending upon their connections. Furthermore, multiple cells can be vertically juxtaposed to create logic sub-blocks of almost any number of gate electrodes.

FIG. 11 shows a standard cell for an output load, similar to that of FIG. 6. A C-shaped diffusion well 70 has a polysilicon gate electrode 72 crossing both arms with one end of the gate electrode 72, the right end in FIG. 11, electrically contacting the diffusion well 70. FIG. 12 shows a standard cell for an inverter with a diffusion well 74, a polysilicon gate electrode 76 for the load and another polysilicon gate 78 for the signal to be inverted.

FIGS. 13 and 14 show two different types of contact areas having diffusion wells 80 and 82 and contact holes 84 and 86 through the intervening oxide. It is recommended that the standard cell library also include sub-blocks or circuits such as latches and push/pull amplifiers which are frequently used. These circuits can be optimized in one hand design and thereafter used as an entity. These specialized circuits are not further described in this application.

It is further recommended that the standard cells be expanded to include blocks having different aspect ratios, specifically the width to length of the channel region. As different cells have their diffusion wells joined, it is desirable that the ratio of the width to total length of the channel regions in series be maintained constant in order to produce a constant drive current. Also, the drive current of the output load should be increased if the output is fanned out to several other logic circuits.

An example of a method of assembling these standard cells to accomplish the objectives of the invention is presented in FIG. 15, which shows two 2-input NOR sub-blocks 88 and 90 together with a load transistor 92. Each of the NOR blocks 88 and 90 may be formed by the standard cell of FIG. 10. Also there is a contact cell of FIG. 14 to provide a contact hole 94 and two contact cells similar to that of FIG. 14 except for the location of their contact holes 96. All the cells forming one of the NOR blocks 88 and 90 are juxtaposed so that their diffusion wells touch or barely overlap, thus forming a continuous diffusion well. Juxtaposed next to the bottom NOR block 88 is the load transistor 92, using the standard cell of FIG. 11. Juxtaposed next to the end of the load transistor that is to be connected to the power supply $V_{DD}$ is a contact cell 98 with a contact hole 100.

The juxtaposition of diffusion wells and juxtaposition of polysilicon, to be described later, can be performed at the mask level so that the various masks provide a continuous structure of juxtaposed elements.

The contact hole 94 provides contact to an overlying first metallization line 102, which is used for the output voltage $V_{out}$. The contact holes 96 provide contact to another overlying first metallization line 104, which is used for the ground line. The contact hole 100 provides contact to yet another overlying first metallization line 106, which conducts the power supply voltage $V_{DD}$. The use of metallizations to connect to isolated diffusions is described by Puri in a technical article entitled "Modified Weinberger Chip Image for Random Logic with Double-Level Metallization" appearing in the *IBM Technical Disclosure Bulletin*, Vol. 19, No. 6, November 1976 at pages 2148–2149. Additional polysilicon lines 108 can be used for input lines to the electrodes 64 by juxtaposing their ends to the electrodes 64. Since the polysilicon gate electrode 72 of the load transistor 92 is connected to the diffusion well at that point, the gate electrode 72 itself can be used as an output through another polysilicon line 110. The layout illustrated in FIG. 15 is part of an alternative to FIG. 8, namely four separated 2-input NOR gates.

The 1-input NOR sub-blocks 52 of FIG. 8 can be realized as follows. The NOR sub-block 90 is instead constructed of only one of the standard cells of FIG. 9 and has one gate electrode 64, one contact hole 94 to the $V_{out}$ first metallization 102 and one contact hole 96 to the first metallization 102. A separated load transistor 92 would require a contact hole to the $V_{out}$ first metallization 102 or an equivalent connection to its gate electrode 72.

As mentioned previously, the location of the load transistor 92 is relatively freely chosen so that the location of the output polysilicon line 110 can be aligned to the next sub-block to the right which it drives. Another important consideration for this separated design is that there is no diffusion well between the upper NOR block 90 and the load transistor 92. As a result, this space can be advantageously used for additional polysilicon interconnections 112 between blocks to the left and blocks to the right. Love, in a technical artical entitled "Modified Weinberger Image for Enhanced Wirability of LSI Chips" appearing in the *IBM Technical Disclosure Bulletin*, Vol. 19, No. 6, November 1976 at pages 2150–2151, discloses the advantages of aligning his load devices with the following gates that they drive. However, his circuit configuration is considered unduly restrictive in other respects.

The logic circuits which have been described so far have been relatively simple. More complex functions can be accomplished in the same vertical array by utilizing additional first metallization lines, similar to the lines 102–106, to provide common potential nodes to different blocks in the column array. Similar voltage nodes are disclosed in the previously cited Love reference. If necessary, the additional lines may be discontinuous and have horizontal offsets. Of course, since all the first metallization lines are formed in a single process step, none of the lines can cross.

One of the advantages of the freely chosen alignment of the blocks within the column is that different gate electrodes in different columns which are controlled by the same signal can be aligned horizontally. An example of such gates are those controlled by a common clocking signal. Then, the interconnection for a common clocking signal can be accomplished by a single continuous polysilicon line which acts both as the gate electrodes as well as the intervening interconnection. By means of the alignment freedom, this common polysilicon line can be a straight horizontal line. It is well known that polysilicon lines can be used for long interconnections, as is believed to be the usage in the Intel 8086 16-bit microprocessor. Uehara et al in a technical article entitled "Optimal Layout of CMOS Function Arrays" appearing in the *IEEE Transactions on Computers*, Vol. C-30, No. 5, 1981 at pages 305–312 describe a method of aligning gate electrodes between different stages. However, their approach envisions a single active area so that the alignment primarily avoids crossover of the interconnections.

Figure 16:
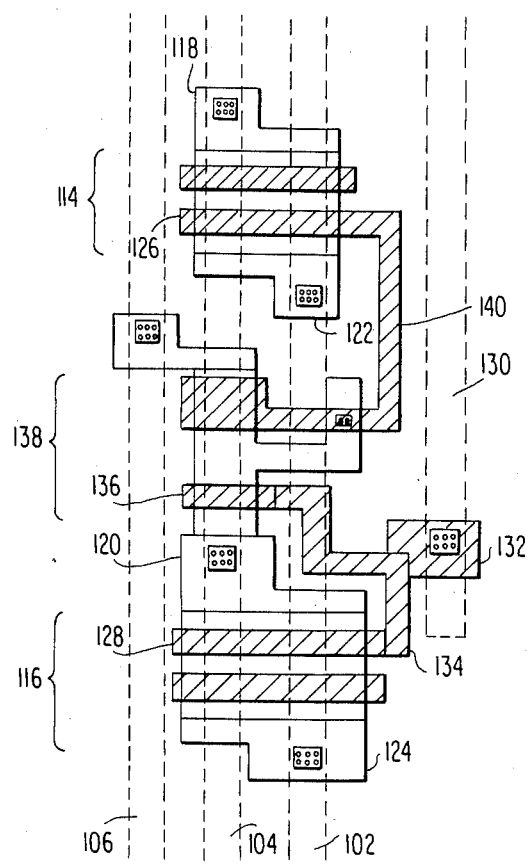

An example of a slightly more complex function implemented in a single row is illustrated in FIG. 16. Two main logic blocks are two NAND sub-blocks 114 and 116 each having their contact cells 118 and 120 contacting the first metallization ground line 104 and their contact cells 122 and 124 contact the first metallization line 102 to the output node $V_{out}$ of the first metallization line 102. However, respective gate electrodes 126 and 128 of the two NAND sub-blocks 114 and 116 are driven by complementary signals of a signal derived from elsewhere in the same column. This signal is conveyed by a terminated first metallization line 130 from elsewhere in the column. A contact cell 132 brings the signal down to the polysilicon layer where it contacts a substantially vertical polysilicon line 134 to one of the electrodes 128. The same polysilicon line 134 conveys the signal directly to a gate electrode 136 of an inverter 138. The complemented output of the inverter 138 is connected to yet another substantially vertical polysilicon line 140 directly connected to the other gate electrode 126. The emphasis here is three-fold. First, different logic sub-blocks, including inverters, can be freely inserted at desirable locations in the column. Secondly, it is desirable that polysilicon be used for vertical connections without the necessity of using metallizations and contact holes. Thirdly, the first metallization layer can be used for conveying signals between separated parts of the column. The first metallization lines need not provide a single direction of signal flow but may define a potential node that can be pulled up or down by any of a multiplicity of sub-blocks attached to that line.

Law et al in U.S. Pat. No. 4,319,396 disclose the design of a single logic block. They break up the diffusions in the column directions and allow the passage of polysilicon lines, commonly serving as interconnects and gate electrodes, between different sub-columns connected in parallel in the logic block. However, they do not appear to envision the passage of polysilicon lines through the diffusion breaks which are not used within that particular logic block.

In several parts of the discussion above, use of first metallization lines has been described. The first metallization lines generally run parallel to the columns or vertically as illustrated in FIGS. 15 and 16. Usually the technology represented by the invention relies upon a second metallization that forms lines running substantially perpendicularly to the first metallization. The second metallization lines are used to form power buses for $V_{DD}$ and ground as well as possibly other fixed voltages. These power buses run horizontally and provide power to multiple columns through connections to first metallization lines running along the columns. Additionally, the second metallization can provide interconnections for logic signals between different columns. Because the second metallization is separated from the first metallization by an insulator layer, and hence from the polysilicon lines and the diffusion wells, the second metallization lines can run independently of the underlying first metallization and polysilicon. Of course, contacts need to be provided between the second metallization and the first metallization. Connections between the second metallization and polysilicon always go through a first metallization. In the prior art, because of the non-alignment of logical outputs to the following inputs, heavy use was made of the second metallization layer to accomodate difficult connections.

However, the contacts required for a second metallization connection occupy valuable chip area and the longer interconnections produce a higher capacitance which must be driven, thus increasing power consumption and lowering speeds. With the alignment possible with the present invention, the use of second metallization for logical signals can be substantially reduced. However, the second metallization can still be used when the connection is difficult, particularly when there would be a severe cross-over problem that could not be accomplished with the few extra first metallization lines that are available.

I claim:

1. A method of fabricating integrated IGFET logic circuits from a plurality of interconnected multi-input logic gates, at least some of the input nodes of individual logic gates being common to more than one logic gate, each logic gate including a number of input signal responsive devices for coupling a logic gate voltage node to a first reference voltage node to represent a first logic state and load means for coupling the logic gate voltage node to a second reference voltage node to represent a second logic state, including the steps of:

establishing a two-dimensional array of logic gates organized in columns and rows, wherein logic gates having common input nodes with other logic gates are placed in the same row and logic gates lacking common input nodes or having input nodes corresponding to input signals generated by others of the logic gates are placed in the same column;

aligning the common input devices of logic gates in different columns such that their input nodes are aligned in the row direction;

allocating a position in the column direction for each of the remaining input devices and load means;

aligning the logic gate voltage nodes, the first reference voltage nodes and the second reference voltage nodes within each logic gate to form three independent sets of linear points running in the column direction;

interconnecting any common voltage nodes between adjacent devices and load means within each logic gate by a first level of interconnection means;

interconnecting by a second level of interconnecting means the input nodes of the logic gates such that each input node is connected to another input node in a different column of logic gates or is connected to a least one point of an additional independent set of linear points representing a circuit input node running in the column direction or is connected to a logic gate voltage node representative of a circuit output node;

providing a plurality of substantially parallel third level interconnecting means aligned substantially in the column direction such that adjacent points within each set of points representing a common voltage node are interconnected; and providing a plurality of fourth level interconnecting means aligned substantially in the row direction such that all of the third plurality of interconnecting means corresponding to the first reference voltage, the second reference voltage, circuit input nodes and circuit output nodes are independently connected.

2. A method of fabricating an integrated circuit, said integrated circuit comprising multiple logic blocks, each said block, receiving as logic signal inputs logic signal outputs of other blocks or logical inputs to said integrated circuit, each block comprising one or more logic circuits, each said logic circuit comprising a load device coupled between a first fixed potential and an output potential and further comprising one or more logic sub-blocks comprising one or more FETs controlled by one or more of said logic signal inputs and coupled to a second fixed potential, said output potential being coupled to a logic signal output of said logic circuit, said method comprising the steps of:

establishing a two-dimensional array organized in columns and rows;

assigning one or more of said blocks to a column;

assigning at least some of said logic sub-blocks to rows so that logic signal inputs of a column are aligned with logic signal outputs of other columns or to logical inputs to other columns to which said logic signal inputs of said column are also connected;

establishing in a substrate a semiconducting area for each said logic sub-block and each said load device;

aligning along said columns points in said semiconducting areas to be connected to said first fixed potential, to said secohd fixed potential and to said output potential;

depositing a first interconnecting level for establishing gate electrodes of said FETs and for interconnecting one or more columns;

depositing an insulating layer over said first interconnecting level;

providing contact holes through said insulating layer at said aligned points; and depositing a second interconnecting level along said columns for providing at least three lines overlying said contact holes, said three lines providing said first fixed potential, said second fixed potential and said output potential, at least some of said three lines extending across some of said semiconducting areas.

3. A method as recited in claim 2, wherein at least one of said logic circuits which includes only one load device comprises a plurality of disjoint semiconducting areas for different ones of a plurality of said logic sub-blocks of said at least one circuit and wherein said first interconnecting layer is provided in an area between said disjoint semiconducting areas.

4. A method as recited in claim 3, further comprising providing contact means between said first interconnecting level interconnecting two or more FETs and at least one semiconducting area.

5. A method as recited in claim 3, wherein said first interconnecting layer of said at least one logic circuit provided in an area between said disjoint semiconducting area does not establish a gate electrode in said at least one circuit but does establish a gate electrode in another logic circuit.

6. A method as recited in claim 2, wherein said deposited first interconnecting levels further interconnects two or more FETs in one of said columns.

7. A method as recited in claim 2, wherein said first interconnecting level is polysilicon and said second interconnecting level is a metal.

8. A method as recited in claim 2, wherein said first metallization further provides lines for additional voltage nodes within one said logic blocks.

9. A method as recited in claim 2, wherein at least one of said logic circuits includes only one load device and a plurality of logic sub-blocks positioned on either side of said only one load device in a direction of said columns.

10. A method of fabricating an integrated circuit, said integrated circuit comprising multiple logic blocks, each said block receiving as logic signal inputs logic signal outputs of other blocks or logical inputs to said integrated circuit, each block comprising one or more logic circuits, each said logic circuit comprising a load device coupled between a first fixed potential and an output potential and further comprising one or more logic sub-blocks comprising one or more FETs controlled by one or more of said logic signal inputs and coupled to a second fixed potential, said output potential being coupled to a logic signal output of said logic circuit, said method comprising the steps of:

establishing a two-dimensional array organized in columns and rows;

assigning one or more of said blocks to a column;

assigning at least some of said logic sub-blocks to rows so that logic signal inputs of a column are positioned with logic signal outputs of other columns or to logical inputs to other columns to which said logic signal inputs of said column are also connected;

establishing in a substrate a semiconducting area for each said logic sub-block and each said load device;

positioning along said columns points in said semiconducting areas to be connected to said first fixed potential, to said second fixed potential and to said output potential;

depositing a first interconnecting level for establishing gate electrodes of said FETs and for interconnecting two or more columns;

depositing an insulating layer of said first interconnecting level;

providing contact holes through said insulating layer at said positioned points; and depositing a second interconnecting level along said columns for providing at least three lines overlying said contact holes, said three lines providing said first fixed potential, said second fixed-potential and said output potential, at least some of said three lines extending across some of said semiconducting areas.

* * * * *